United States Patent [19]
Ilkbahar

[11] Patent Number: 6,031,385
[45] Date of Patent: Feb. 29, 2000

[54] METHOD AND APPARATUS FOR TESTING COMPENSATED BUFFER CIRCUITS

[75] Inventor: Alper Ilkbahar, Santa Cruz, Calif.

[73] Assignee: Intel Corporation, Santa Clara, Calif.

[21] Appl. No.: 08/823,215

[22] Filed: Mar. 24, 1997

[51] Int. Cl.[7] .................................................. G01R 31/28
[52] U.S. Cl. ........................... 324/763; 324/765; 324/617
[58] Field of Search ................................. 371/22.3, 22.5; 324/763, 765, 678, 617

[56] References Cited

U.S. PATENT DOCUMENTS

| | | |
|---|---|---|
| 4,975,598 | 12/1990 | Borkar . |
| 5,063,308 | 11/1991 | Borkar . |
| 5,155,432 | 10/1992 | Mahoney ................................. 324/73.1 |
| 5,260,949 | 11/1993 | Hashizume ............................... 324/763 |
| 5,528,166 | 6/1996 | Ikbahar . |
| 5,715,254 | 2/1998 | Whetsel .................................. 324/765 |

OTHER PUBLICATIONS

Donnelly KS et al.: A 660 MB/s Interface Megacell Portable Circuit in 0.3 μm CMOS ASIC, IEEE J of Solid–State Circuits, vol. 31(12): Dec. 1996.

Gabara TJ et al.: Forming Damped LRC Parasitic Circuits in Simultaneously Switched CMOS Output Buffers, IEEE J of Solid–State Circuits, vol. 32(3), Mar. 1997.

*Primary Examiner*—Josie Ballato
*Assistant Examiner*—Jose M. Solis
*Attorney, Agent, or Firm*—Blakely, Sokoloff, Taylor & Zafman LLP

[57] ABSTRACT

A method and an apparatus for testing compensated input/output buffers. In one embodiment, a compensated input/output buffer includes a node from which a plurality of compensation devices are coupled in parallel to a particular voltage level, such as for example $V_{CC}$ or ground. Compensation control signals are received by each one of the compensation devices such that the compensation signals are configured to selectively switch on and off each one of the plurality of compensation devices. An input/output test bus is coupled to the node and thus has access to each one of the compensation devices. Test circuitry is configured to selectively switch on and off each one of the compensation devices such that a switchable conductive path is formed from the node to the particular potential level through each one of the plurality of compensation devices. By observing the switchable conductive paths through each respective compensation device from the input/output test bus, proper functionality of the compensation devices in the compensated input/output buffer is verified.

20 Claims, 5 Drawing Sheets

METHOD AND APPARATUS FOR TESTING COMPENSATED BUFFER CIRCUITS

RELATED APPLICATIONS

This application is related to U.S. Pat. No. 5,898,321, issued Apr. 27, 1999, entitled "Method and Apparatus For Slew Rate and Impedance Compensating Buffer Circuits," and assigned to the assignee of the present invention.

This application is also related to U.S. Pat. No. 5,869,983, issued Feb. 9, 1999, entitled, "Method and Apparatus For Controlling Compensating Buffers," and assigned to the assignee of the present invention.

BACKGROUND OF THE INVENTION

1. Field of the Invention

The present invention relates generally to integrated circuit technology and, more specifically, the present invention relates to the testing of integrated circuits.

2. Description of the Related Art

To achieve high performances in modem integrated circuits, it is often necessary to utilize high speed communications busses. As integrated circuit technologies continue to advance, the frequencies at which the integrated circuits operate increase accordingly. It has been a considerable challenge for circuit designers to design busses that are able to match the speed performance of the core speed of modern central processing units (CPUs). One reason for the difficulty of continuously increasing bus speeds to match the continuously increasing CPU core speeds is that input/output buffers coupled to the busses must often operate across a wide variety of operating conditions. For instance, the performance of an input/output buffer changes with respect to conditions such as process, voltage and temperature.

The use of impedance compensated input/output buffers have provided one prior art solution to the problems associated with the changes in operating conditions such as process, voltage and temperature. Impedance compensated input/output buffers address the problems associated with varying conditions by providing mechanisms to help maintain the optimum characteristics of input/output buffer drivers over a wide range of operating conditions.

Figure 1:
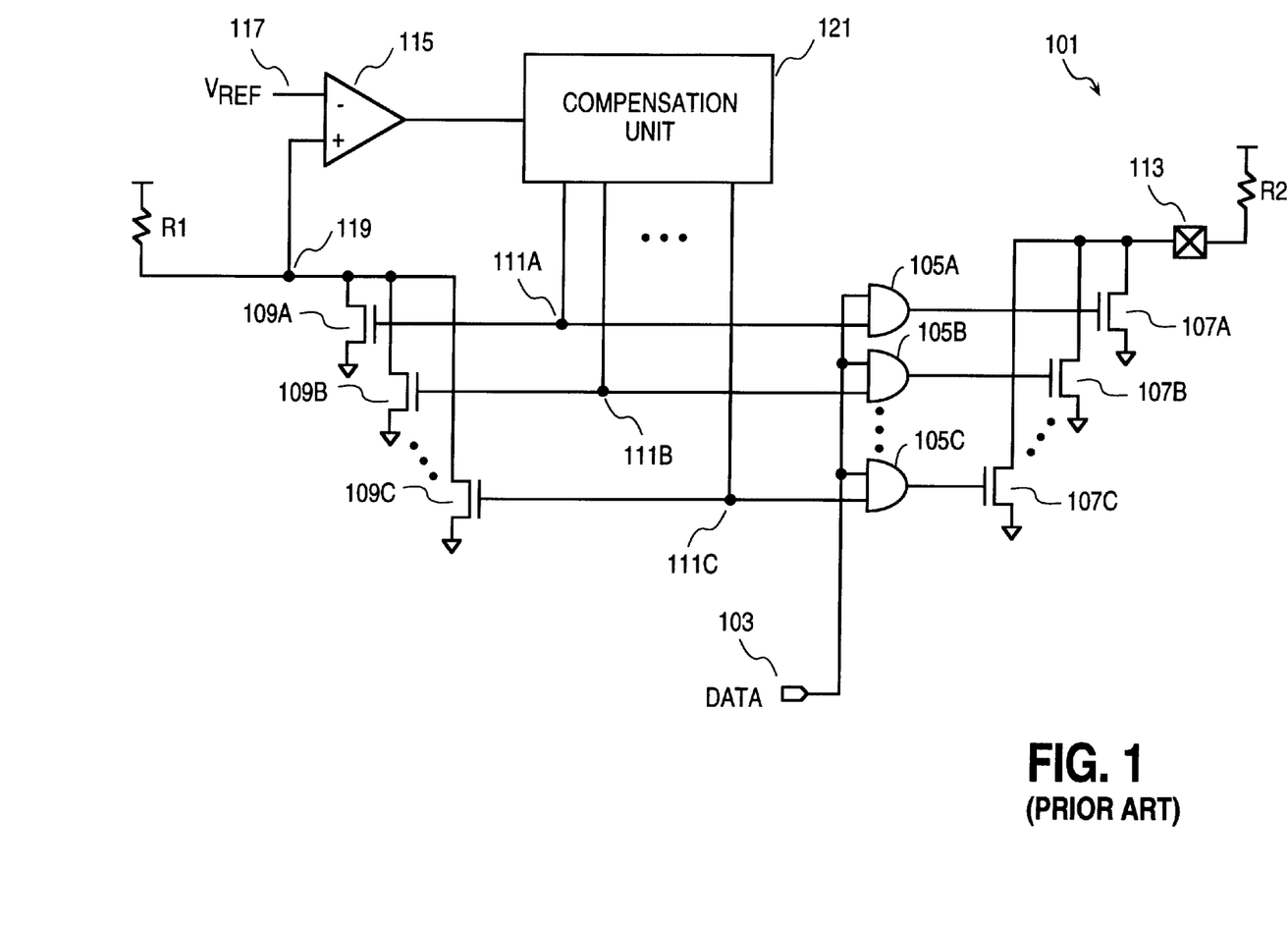
FIG. 1 is a schematic of a prior art impedance compensated input/output buffer.

FIG. 1 is an illustration of a prior art impedance compensated input/output buffer 101 that employs digital impedance compensation, which relies basically on the same principles as an analog-to-digital converter. In this scheme, output buffers and their pre-drivers include a plurality of transistors 107A–C coupled in parallel between an output pin 113 and ground. Compensation unit 121 generates digital information via signals 111A–C, which indicate the number of parallel coupled transistors 107A–C in every buffer that should be activated at any given time to compensate for varying operating conditions. For example, under slow operating conditions, which include low voltage, high temperature and slow process corner, many transistors 107A–C may need to be activated to pull the voltage at output pin 113 to ground. In contrast, under faster operating conditions, fewer parallel coupled transistors 107A–C may need to be switched on for similar performance.

Although prior art input/output buffer 101 has the ability to compensate for varying operating conditions, one problem with input/output buffer 101 is that it is difficult to test the functionality of each of the devices since the parallel coupled transistors create logic redundancies. For instance, transistors 107A–C as well as transistors 109A–C are coupled in parallel between output pin 113 and ground and node 119 and ground respectively. For optimum performance, it is desired that all transistors 107A–C and 109A–C are completely functional.

It is possible in a testing environment, that due to a defect, one or more of the parallel coupled devices 107A–C and 109A–C may not function properly, but the remaining devices could still function properly and a tester (not shown) coupled to output pin 113 and node 119 would be unable to detect a defective device based on logic levels or simple timing. As a consequence, that defective device may not be detected in a testing environment but could, however, cause input/output buffer 101 to fail in a system environment.

Therefore, what is desired is a method and an apparatus for testing the parallel coupled devices in compensated input/output buffers that are otherwise not testable due to the logic redundancies created by the parallel coupled nature of the devices in compensated input/output buffers. Such a method and apparatus would verify functionality of all compensation devices in compensated input/buffers. Moreover, in a built-in self-test implementation, such a method and an apparatus would eliminate the need for any additional test equipment.

SUMMARY OF THE INVENTION

A method and an apparatus for testing compensated input/output buffers is described. In one embodiment, an integrated circuit includes a compensated input/output buffer that has a plurality of compensation devices coupled in parallel between a node and a particular potential level. A plurality of compensation control signals are coupled to each one of the plurality of compensation devices such that each one of the compensation control signals selectively switches the corresponding compensation device. Test circuitry coupled to the node and the plurality of compensation control signals is configured to selectively switch each one of the plurality of compensation devices to verify that a switchable conductive path exists through the node to the particular potential through each one of the plurality of compensation devices. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for testing compensated input/output buffers is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

Figure 2:
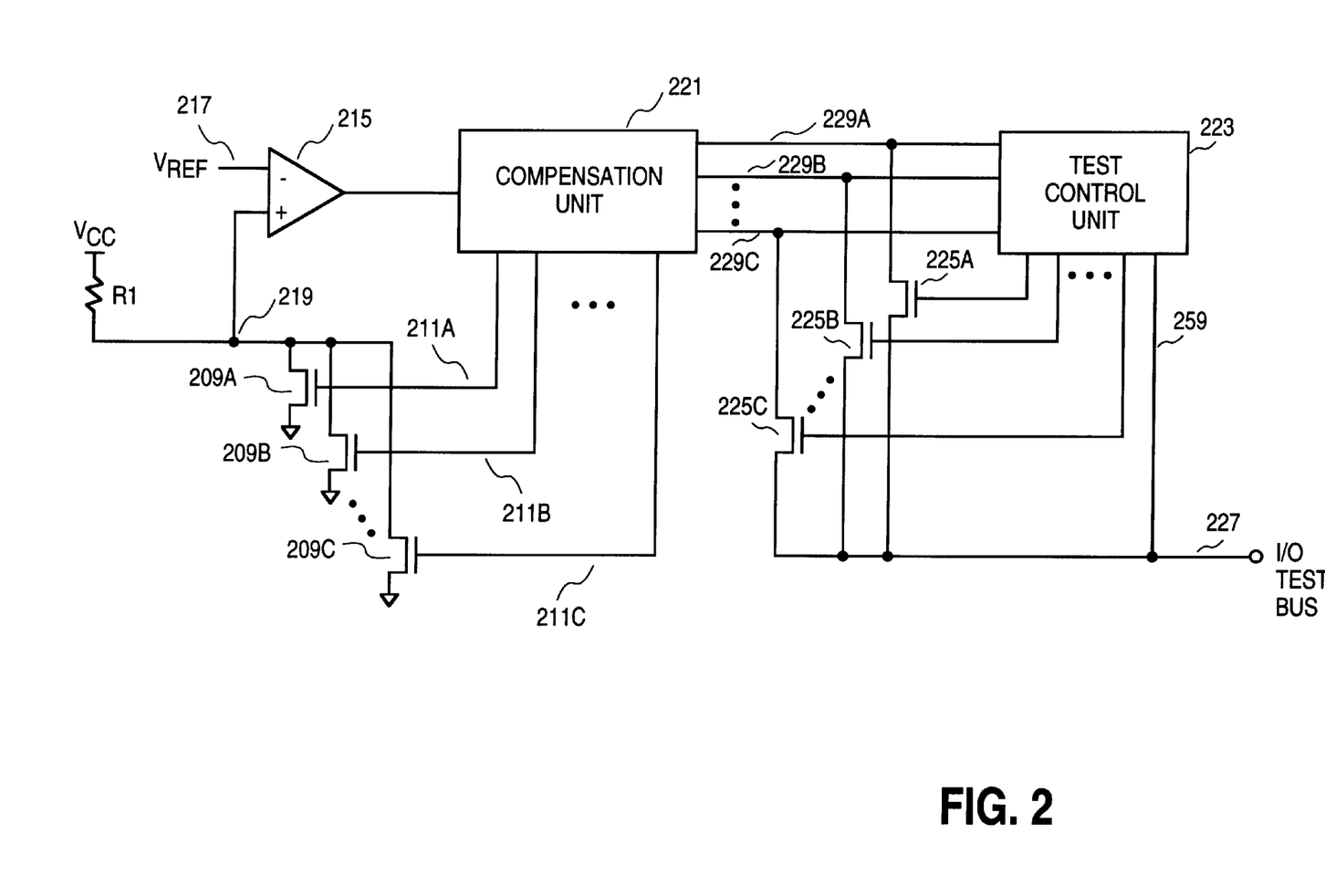
FIG. 2 is a simplified schematic of one aspect of the present invention that tests the functionality of a compensation unit utilized in combination with a compensated input/output buffer.

FIG. 2 is a block diagram of test circuitry in accordance with the teachings of the present invention to verify the proper operation of a compensation unit 221, which generates compensation signals 229A–C for use by a compensated input/output buffer (not shown). As shown in FIG. 2, transistors 209A–C are coupled in parallel between resistor R1 and ground. Comparator 215 has one input coupled to receive $V_{REF}$ 217 and another input coupled to node 219, which is located between resistor R1 and the plurality of parallel coupled transistors 209A–C. The output of comparator 215 is received by compensation unit 221, which generates signals 211A–C, each of which is coupled to a corresponding gate of transistors 209A–C.

In operation, compensation unit 221 and comparator 215 act as an analog-to-digital converter as comparator 215 compares the voltage at $V_{REF}$ 217 with the voltage at node 219. The output of comparator 215 is received by compensation unit 221, which selectively switches on and off each one of the parallel coupled transistors 209A–C until the voltage at node 219 is equal to the voltage at $V_{REF}$ 217. compensation unit 221 generates compensation signals 229A–C which are received by test control unit 223 and are ultimately received by a compensated input/output buffer (not shown).

As shown in FIG. 2, each one of the compensation signals 229A–C are individually coupled to input/output test bus 227 through transistors 225A–C respectively. The gates of transistors 225A–C are individually controlled by test control unit to individually couple input/output test bus 227 to each individual compensation signal 229A–C. In one embodiment of the present invention, test control unit 223 is able to sample signals present on input/output test bus 227 via signal line 259.

In operation, the functionality of compensation unit 221 may be tested by initially setting $V_{REF}$ 217 to equal $V_{CC}$. If compensation unit 221 is functioning properly, all transistors 209A–C will be switched off with signals 211A–C in order to bring the voltage at node 219 up to $V_{CC}$. In addition, compensation unit 221 generates compensation signals 229A–C that indicate that all transistors 209A–C have been switched off to bring the voltage at node 219 up to $V_{CC}$.

Test control unit 223 selectively probes each one of the compensation signals 229A–C through transistors 225A–C via input/output test bus 227 and signal line 259 to verify that the proper compensation signals 229A–C have been generated by compensation unit 221. Next, $V_{REF}$ 217 is incrementally decremented in voltage such that each one of the plurality of transistors 209A–C are switched accordingly to match the voltage at node 219 with the particular voltage at $V_{REF}$ 217 at a particular time. Thus, compensation signals 229A–C are verified with test control unit 223 to confirm proper functionality of compensation unit 221 and the plurality of transistors 209A–C.

Figure 3:
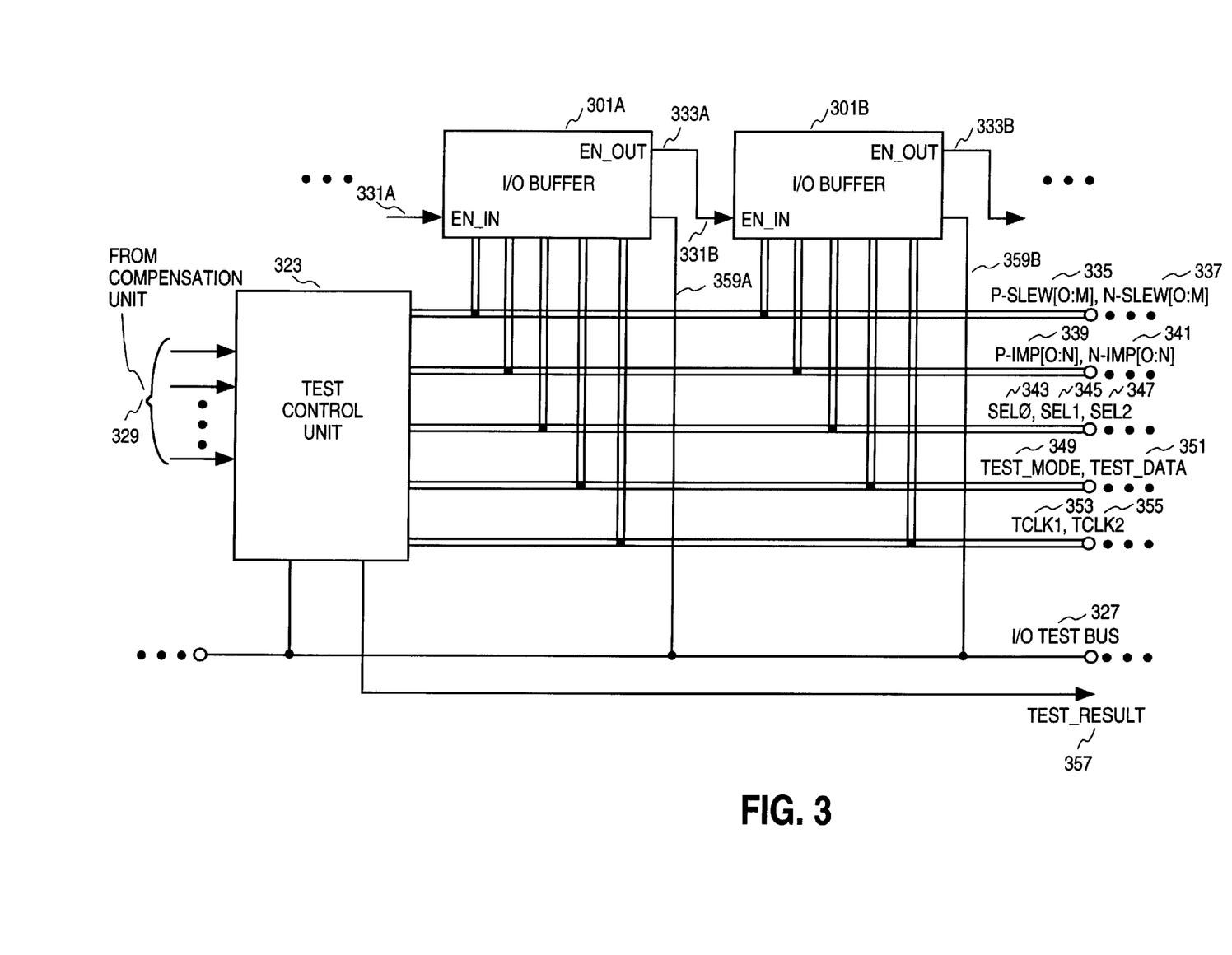
FIG. 3 is a block diagram of test circuitry configured to test a plurality of compensated input/output buffers in accordance with the teachings of the present invention.

FIG. 3 is a block diagram of a test control unit 323 coupled to a plurality of compensated input/output buffers 301A and 301B to verify their proper functionality in accordance with the teachings of the present invention. Test control unit 323 receives compensation signals 329 from a compensation unit (not shown). Observability of the compensation devices in input/output buffers 301A and 301B is provided to the input/output test bus 327 and then to test control unit 323 through signal lines 359A and 359B coupled to each one of the input/output buffers 301A and 301B.

In one embodiment of the present invention, the test control circuitry is configured in a built in self test (BIST) structure such that each input/output buffer 301A and 301B may be tested for proper functionality without the need for an elaborate or expensive testing apparatus. In a BIST environment, each input/output buffer receives an enable in signal, shown as EN_IN 331A and 331B, and then generates an enable out signal, shown as EN_OUT 333A and 33B respectively. As shown in FIG. 3, each input/output buffer is serially connected in a daisy-chain fashion such that each one of the input/output buffers are sequentially tested.

In operation, an input/output buffer is tested when an active signal is received at its EN_IN port and after testing is successfully completed, an active signal is generated at the input/output buffer's EN_OUT port to be received at the next sequential input/output buffer's EN_IN port for testing. If all input/output buffers are successfully tested and no defects are found, test control unit 323 generates a TEST_RESULT signal 357 that indicates all input/output buffers function properly. If a defect is detected in one of the input/output buffers, then test control unit 323 generates a TEST_RESULT signal 357 that indicates that one of the input/output buffers has a defect.

To test the compensated the input/output buffers, test control unit 323 generates a plurality of signals that are received by each input/output buffer 301A and 301B during testing. The signals generated by test control unit 323 include compensation signals, which include P-SLEW[0:M] 335, N-SLEW[0:M] 337, P-IMP[0:N] 339 and N-IMP[0:N] 341. Test control unit 323 also generates select signals SEL0 343, SEL1 345 and SEL2 347. Test mode and test data signals are generated, which are shown as TEST_MODE 349 and TEST_DATA 351. Several test clock signals are generated by test control unit 323 that include TCLK1 353 and TCLK2 355. As shown in FIG. 3, each of the described signals generated by test control unit 323 are coupled to each one of the input/output buffers 301A and 301B.

Figure 4:
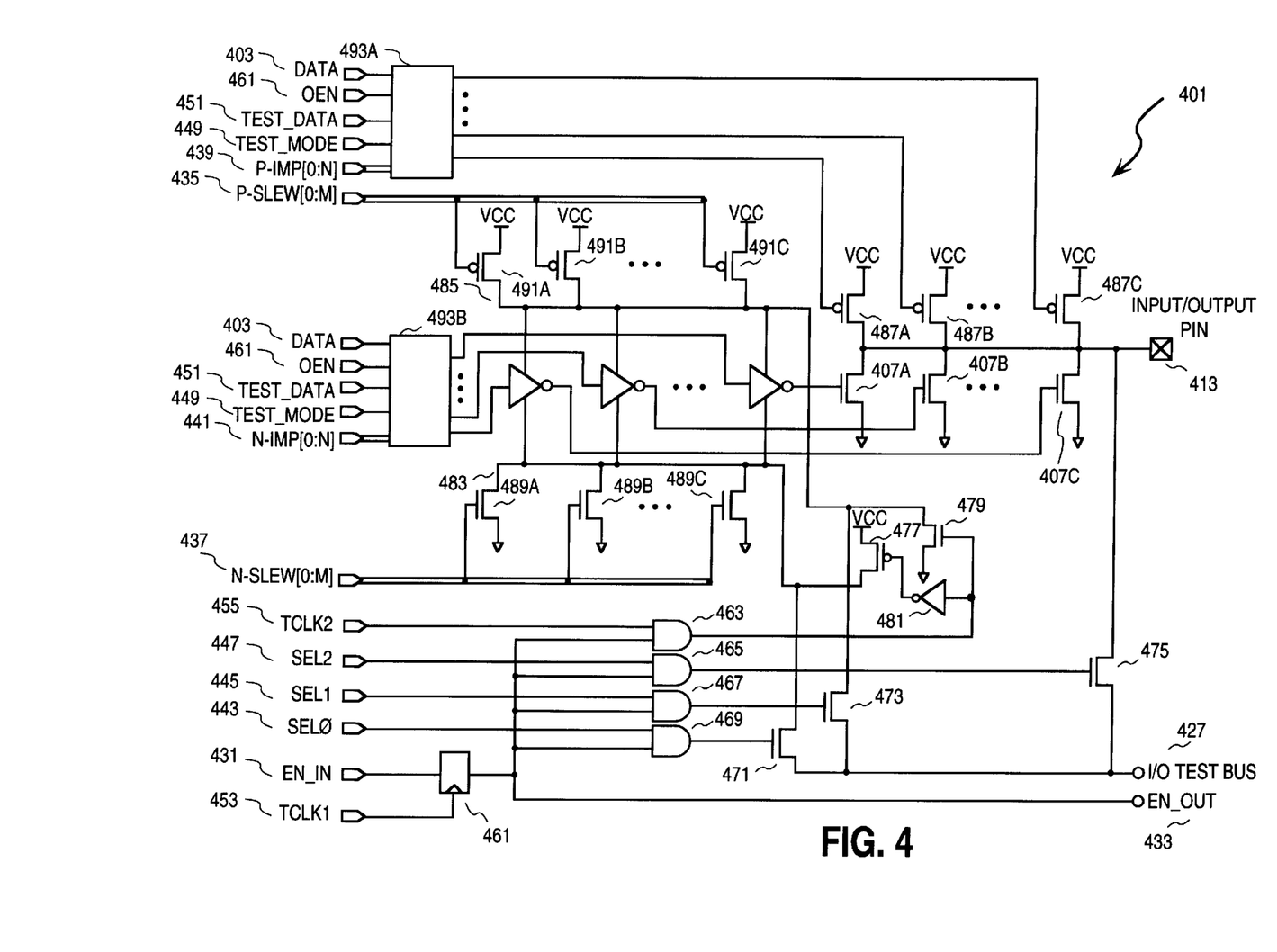
FIG. 4 is a schematic of another aspect of the present invention including test circuitry coupled to a compensated input/output buffer to test the buffer in accordance with the teaching of the present invention.

FIG. 4 is a schematic of test circuitry coupled to the output portion of a compensated input/output buffer 401 to verify proper functionality of compensation devices in accordance with the teachings of the present invention. Input/output buffer 401 is a slew rate and impedance compensated input/output buffer and is described in greater detail in U.S. Pat. No. 5,898,321, issued Apr. 27, 1999, entitled, "Method and Apparatus For Slew Rate and Impedance Compensating Buffer Circuits," and assigned to the assignee of the present invention.

Input/output buffer 401 includes a plurality of n-channel transistors 407A–C coupled in parallel between an output node, shown as input/output pin 413 and ground as well as a plurality of p-channel transistors 487A–C coupled in parallel between input/output pin 413 and $V_{CC}$. Input/output buffer 401 also includes a plurality of p-channel transistors 491A–C coupled in parallel between $V_{CC}$ and a positive rail 485. A plurality of n-channel transistors 489A–C are coupled in parallel between a negative rail 483 and ground. It is appreciated that the plurality of parallel coupled p-channel transistors 487A–C and 491A–C as well as the plurality of parallel coupled n-channel transistors 407A–C and 489A–C act as compensation devices for input/output buffer 401 to compensate for varying conditions such as process, voltage and temperature.

In one embodiment of the present invention, p-channel transistors 487A–C are controlled in part by compensation signals P-IMP[0:N] 439 while n-channel transistors 407A–C are controlled in part by compensation signals N-IMP[0:N] 441. P-channel transistors 491A–C are controlled by compensation signals P-SLEW[0:M] 435 while n-channel transistors 489A–C are controlled by compensation signals N-SLEW[0:M] 437. In another embodiment of the present invention, it is noted that the same compensation control signals that control p-channel transistors 491A–C may be used to control p-channel transistors 487A–C while the compensation signals that control n-channel transistors 489A–C may be used to control n-channel transistors 407A–C. In yet another embodiment, the same compensation control signals that control p-channel transistors 491A–C may be used to control n-channel transistors 489A–C while the compensation signals that control p-channel transistors 487A–C may be used to control n-channel transistors 407A–C.

With the present invention, observability of each of the compensation devices of the input/output buffer 401 is provided to input/output test bus 427. In particular, access to input/output pin 413 is provided through transistor 475. Access to the positive rail 485 is provided through transistor 473. Access to the negative rail 483 is provided through transistor 471. It is noted that in another embodiment, transistor 475 may be coupled to an output of an input buffer (not shown) coupled to node 413 to provide access to and thus enable testing of the input buffer in accordance with the teachings of the present invention.

The presently described test circuitry also includes precharge circuitry which is configured to precharge the positive rail 485 to ground through n-channel transistor 479 while the negative rail 483 is configured to be precharged to $V_{CC}$ through p-channel transistor 477.

As shown in FIG. 4, latch 461 is configured to latch an input enable signal EN_IN 431 in response to a clock edge on the TCLK1 453 signal line. After an active enable signal is received and latched, the enable signal is output by latch 461 and is received by logical-AND gates 463, 465, 467 and 469 as well as the output enable signal line EN_OUT 433. Afterwards, the second clock signal TCLK2 455 and the three select signals SEL0 443, SEL1 445, and SEL2 447 are cycled through in coordination with the compensation signals P-IMP[0:N] 439, P-SLEW[0:M] 435, and N-IMP[0:N] 441 and N-SLEW[0:M] to individually and sequentially test each one of the transistors 491A–C, 487A–C, 489A–C and 407A–C. During test, logic 493A combines signal DATA 403, output enable signal OEN 461, TEST_DATA 451, TEST_MODE 449 and P-IMP[0:N] signals 439 using well known techniques to coordinate the switching of p-channel transistors 487A–C. Similarly, logic 493B uses well known techniques to combine signals DATA 403, OEN 461, TEST_DATA 451, TEST_MODE 449 and N-IMP[0:N] 441 signals to coordinate testing of n-channel transistors 407A–C.

In operation, after an active EN_IN 431 signal is latched with latch 461, TCLK2 455 is used to precharge the positive rail 485 to ground through n-channel transistor 479 and precharge negative rail 483 to $V_{CC}$ through p-channel transistor 477. Next, SEL0 443 is used to connect the negative rail 483 to the input/output test bus 427 through transistor 471 to verify that the negative rail 483 has been precharged to $V_{CC}$. SEL1 445 is used to connect input/output test bus 427 to positive rail 485 to verify that positive rail 485 has been precharged to ground. Afterwards, negative rail 483 can be pulled back down to ground through one of the transistors 489A–C under control of N-SLEW[0:M] and this change in potential can be verified by the input/output test bus 427 through n-channel transistor 471.

Similarly, positive rail 485 can be pulled back up to $V_{CC}$ through one of the p-channel transistors 491A–C under control of P-SLEW[0:M] 435. This change in potential may be observed by the input/output test bus 427 through n-channel transistor 473 under control of SEL1 445.

Each p-channel transistor 491A–C and n-channel transistor 489A–C may be successively verified by the present invention by cycling through the above described steps for each transistor until each transistor is verified for proper functionality. That is, positive rail 485 and negative rail 483 are each initially precharged to low and high levels respectively before verifying the switchable conductive paths through each p-channel transistor 491A–C and n-channel transistor 489A–C.

P-channel transistors 487A–C and n-channel transistors 407A–C may also be individually verified by separately activating each one of the n-channel transistors 407A–C in an alternating fashion with an individual one of the p-channel transistors 487A–C which will result in the voltage at input/output pin 413 toggling between $V_{CC}$ and ground if each one of the p-channel transistors 487A–C and n-channel transistors 407A–C function properly. Observability of the toggling potential at input/output pin 413 may be observed by the input/output test bus 427 through transistor 475, which is under control of SEL2 447. All p-channel transistors 487A–C and n-channel transistors 407A–C are verified for proper functionality after each transistor is individually utilized to toggle the voltage at input/output pin 413.

After each one of the p-channel transistors 491A–C and 487A–C, and n-channel transistors 489A–C and 407A–C are verified for proper functionality with the presently described test circuitry, another clock edge of TCLK1 453 is received by latch 461 which latches out the enable signal EN_IN 431 and the enable signal will be latched into the next input/output buffer to enable testing.

Thus, by performing the above described steps, each one of the p-channel transistors 491A–C and n-channel transistors 489A–C is individually and selectively switched to verify proper functionality. Specifically, p-channel transistors 491A–C are each verified by checking for the switchable conductive path between positive rail 485 and $V_{CC}$. N-channel transistors 489A–C are each verified by checking for the switchable conductive path between negative rail 483 and ground. P-channel transistors 487A–C are each verified by checking for the switchable conductive path between input/output pin 413 and $V_{CC}$. N-channel transistors 407A–C are each verified by checking for the switchable conductive path between input/output pin 413 and ground.

Figure 5:
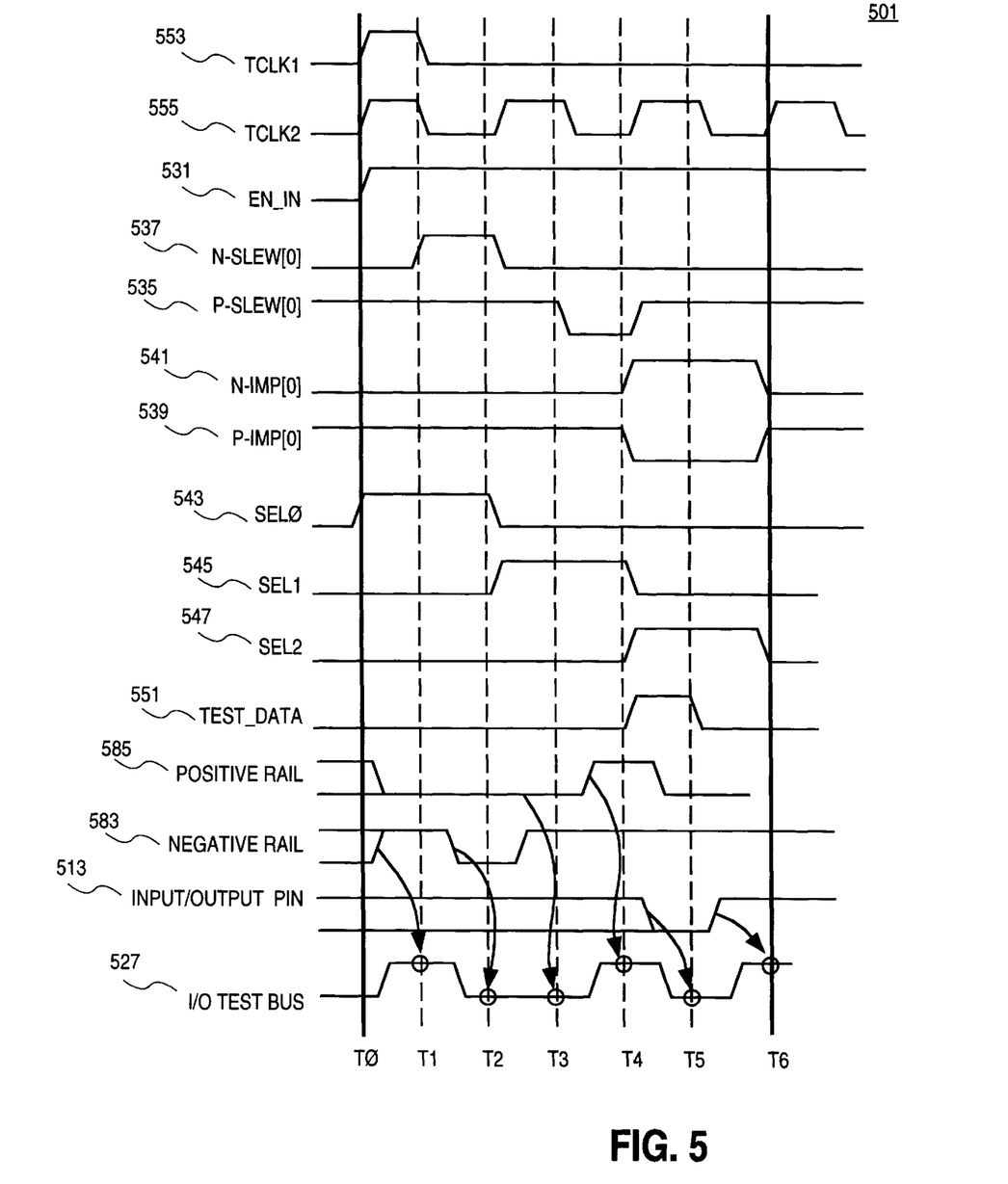
FIG. 5 is a timing diagram of signal lines of test circuitry and a compensated input/output buffer being tested in accordance with the teachings of the present invention.

FIG. 5 is a timing diagram 501 showing the relationship of the signals described with respect to FIG. 4 during a test of a compensated input/output buffer in accordance with the teaching of the present invention. As shown in FIG. 5, rising edges of TCLK1 533, TCLK2 555, EN_IN 531 and SEL0 543 are all received at time T0. Thus, positive rail 585 is precharged to a low level and negative rail 583 is precharged to a high level through transistors 479 and 477 of FIG. 4 respectively. With SEL0 high, input/output test bus 527 is pulled high through transistor 471 in FIG. 4.

At time T1, N-SLEW[0] 537 is activated which selectively switches on one of the n-channel transistors 489A–C and thereby pulls negative rail 583 down to a low level which is also observed on input/output test bus 527.

At time T2, SEL1 545 is activated which allows input/output test bus 527 to observe the positive rail 5 through transistor 473. Thus, input/output test bus 527 is able to verify that positive rail 585 has been properly precharged to a low level.

At time T3, P-SLEW[0] 535 is dropped to a low level which selectively switches on one of the p-channel transistors 491A–C of FIG. 4 to pull the potential at positive rail 585 to a high value. With SEL1 545 at a high level, input/output test bus 527 is able to observe the high level on positive rail 585 through transistor 473 of FIG. 4.

At time T4, N-IMP[0] 541 is pulled to a high level and P-IMP[0] 539 is pulled to a low level. This allows one of the p-channel transistors 487A–C to be enabled and a corresponding one of the n-channel transistors 407A–C to be enabled. At the time T4, SEL2 547 is also activated which allows input/output test bus 527 to observe the input/output pin 413 through transistor 475 of FIG. 4. At time T4, TEST_DATA 551 is pulled from low to high which generates a corresponding low level signal at input/output test pin 513 as observed by input/output test bus 527. This low level signal is provided by the n-channel transistor that was enabled by N-IMP[0] pulling input/output test pin 513 down to ground.

At time T5, TEST_DATA 551 switches from high to low which results in the input/output pin 513 being pulled from low to high. This high level is observed by input/output test bus 527 since SEL2 547 is still at a high level. This high level signal is provided by the p-channel transistor that was enabled by P-IMP[0] pulling input/output test pin 513 up to $V_{CC}$.

By controlling the signals as described above, observability of each of the compensation devices in a compensated input/output buffer is provided to the input/output test bus of the presently described invention. In addition, with the built in self test structure described, verification testing of each one of the compensated input/output buffers is realized without the need for a tester apparatus.

Thus, what has been described is a method and an apparatus for testing compensated input/output buffers. In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An integrated circuit, comprising:
   a compensated input/output buffer having a first node, the compensated input/output buffer including a first plurality of compensation devices coupled in parallel between a first potential and the first node;
   a plurality of first compensation signals coupled to each one of the first plurality of compensation devices, each one of the first compensation signals coupled to selectively switch a corresponding one of the plurality of first compensation devices; and
   test circuitry coupled to the first node and the plurality of first compensation signals, the test circuitry configured to selectively switch each one of the plurality of first compensation devices to verify a switchable conductive path from the first node to the first potential through each one of the plurality of first compensation devices.

2. The integrated circuit described in claim 1 further comprising:
   a second plurality of compensation devices included in the compensated input/output buffer, the second plurality of compensation devices coupled in parallel between a second potential and the first node; and
   a plurality of second compensation signals coupled to the test circuitry and to each one of the second plurality of compensation devices, each one of the second compensation signals coupled to selectively switch a corresponding one of the plurality of second compensation devices;
   wherein the test circuitry is further configured to selectively switch each one of the plurality of second compensation devices to verify a switchable conductive path from the first node to the second potential through each one of the plurality of second compensation devices.

3. The integrated circuit described in claim 1 further comprising:
   a plurality of inverters, each one of the plurality of inverters having an output coupled to a corresponding gate of each one of the first plurality of compensation devices, the plurality of inverters coupled in parallel between first and second rails;
   a third plurality of compensation devices coupled in parallel between the first rail and the first potential;
   a plurality of third compensation signals coupled to the test circuitry and to each one of the third plurality of compensation devices, each one of the third compensation signals coupled to selectively switch a corresponding one of the plurality of third compensation devices;
   a fourth plurality of compensation devices coupled in parallel between the second rail and a second potential;
   a plurality of fourth compensation signals coupled to the test circuitry and to each one of the fourth plurality of compensation devices, each one of the fourth compensation signals coupled to selectively switch a corresponding one of the plurality of fourth compensation devices;
   wherein the test circuitry is further coupled to the first and second rails, the test circuitry further configured to selectively switch each one of the plurality of third compensation devices to verify a switchable conductive path from the first rail to the first potential through each one of the plurality of third compensation devices, the test circuitry further configured to selectively switch each one of the plurality of fourth compensation devices to verify a switchable conductive path from the second rail to the second potential through each one of the plurality of fourth compensation devices.

4. The integrated circuit described in claim 3 further comprising:
   a first precharge device included in the test circuitry coupled between the first rail and the second potential; and
   a second precharge device included in the test circuitry coupled between the second rail and the first potential.

5. The integrated circuit described in claim 1 further comprising:
   a plurality of calibration devices coupled between a resistance and the first potential; and
   a compensation unit coupled to each one of the plurality of calibration devices and the test circuitry, the compensation unit configured to selectively switch each one of the plurality of calibration devices, the compensation unit coupled to generate a compensation control signal in response to calibration devices that are switched;

wherein the test circuitry is coupled to receive the compensation control signal to ascertain the calibration devices that are switched.

6. The integrated circuit described in claim 1 further comprising a test control unit included in the test circuitry, the test control unit coupled to the compensated input/output buffer through an input/output test bus, the test control unit configured to test the compensated input/output buffer during a built in self test of the integrated circuit, the test control unit further configured to generate a test result of the built in self test of the compensated input/output buffer.

7. The integrated circuit described in claim 1 wherein the first node is an output node of the compensated input/output buffer.

8. A method of testing a compensated input/output buffer having a first plurality of compensation devices coupled in parallel between a first node and a first potential, the method comprising the steps of:

charging the first node to a second potential;

selectively discharging the first node to a first potential through one of the first plurality of compensation devices;

verifying that the first node is discharged to the first potential;

recharging the first node to the second potential;

selectively discharging the first node to the first potential through another one of the first plurality of compensation devices; and verifying that the first node is discharged to the first potential.

9. The method described in claim 8 wherein the compensated input/output buffer further includes a second plurality of compensation devices coupled in parallel between the first node and a second potential, wherein the step of charging the first node to the second potential is performed by selectively charging the first node to the second potential through one of the second plurality of compensation devices.

10. The method described in claim 9 wherein the step of recharging the first node to the second potential is performed by selectively recharging the first node to the second potential through another one of the second plurality of compensation devices.

11. The method described in claim 8 including the additional step of verifying that the first node is charged to the second potential, wherein the additional step of verifying that the first node is charged to the second potential is performed after the step of charging the first node to the second potential and before the step of selectively discharging the first node to the first potential through one of the first plurality of compensation devices.

12. The method described in claim 8 including the additional step of verifying that the first node is recharged to the second potential, wherein the additional step of verifying that the first node is recharged to the second potential is performed after the step of recharging the first node to the second potential and before the step of selectively discharging the first node to the first potential through another one of the first plurality of compensation devices.

13. The method described in claim 8 wherein the compensated input/output buffer further includes a plurality of inverters coupled in parallel between first and second rails, the compensated input/output buffer further including a third plurality of compensation devices coupled in parallel between the first rail and the first potential, the compensated input/output buffer further including a fourth plurality of compensation devices coupled in parallel between the second rail and a second potential, the method including the additional steps of:

charging the first rail to the second potential;

selectively discharging the first rail to the first potential through one of the third plurality of compensation devices;

verifying that the first rail is discharged to the first potential;

recharging the first rail to the second potential;

selectively discharging the first rail to the first potential through another one of the third plurality of compensation devices; and verifying that the first rail is discharged to the first potential.

14. The method described in claim 13 including the additional steps of:

discharging the second rail to the first potential;

selectively charging the second rail to the second potential through one of the fourth plurality of compensation devices;

verifying that the second rail is charged to the second potential;

redischarging the second rail to the first potential selectively recharging the second rail to the second potential through another one of the fourth plurality of compensation devices; and verifying that the second rail is recharged to the second potential.

15. The method described in claim 8 wherein the compensated input/output buffer is coupled to receive compensation control signals from a compensation unit, wherein the compensation unit is coupled to an output of a comparator and a plurality of calibration devices coupled in parallel between a resistance and the first potential, the plurality of calibration devices further coupled in parallel between a first input of the comparator and the first potential, the compensation unit configured to selectively switch each one of the plurality of calibration devices, the method including the additional steps of:

initializing a voltage at a second input of the comparator substantially equal to the second potential;

incrementally decrementing the voltage at the second input of the comparator down to the first potential; and monitoring the compensation control signals generated by the compensation unit as the voltage at the second input of the comparator is incrementally decremented to verify that each one of the plurality of calibration devices properly switches.

16. The method described in claim 8 wherein the compensated input/output buffer is tested during a built in self test of the compensated input/output buffer, the method including the additional step of generating a test result.

17. An integrated circuit for testing a compensated input/output buffer having a first plurality of compensation devices coupled in parallel between a first node and a first potential, the integrated circuit comprising:

means for charging the first node to a second potential;

means for selectively discharging the first node to a first potential through one of the first plurality of compensation devices;

means for verifying that the first node is discharged to the first potential;

means for recharging the first node to the second potential;

means for selectively discharging the first node to the first potential through another one of the first plurality of compensation devices; and means for verifying that the first node is discharged to the first potential.

18. The integrated circuit described in claim 17 wherein the compensated input/output buffer further includes a plurality of inverters coupled in parallel between first and second rails, the compensated input/output buffer further including a third plurality of compensation devices coupled in parallel between the first rail and the first potential, the compensated input/output buffer further including a fourth plurality of compensation devices coupled in parallel between the second rail and a second potential, the integrated circuit further comprising:

means for charging the first rail to the second potential;

means for selectively discharging the first rail to the first potential through one of the third plurality of compensation devices;

means for verifying that the first rail is discharged to the first potential;

means for recharging the first rail to the second potential;

means for selectively discharging the first rail to the first potential through another one of the third plurality of compensation devices; and means for verifying that the first rail is discharged to the first potential.

19. The integrated circuit described in claim 18 further comprising:

means for discharging the second rail to the first potential;

means for selectively charging the second rail to the second potential through one of the fourth plurality of compensation devices;

means for verifying that the second rail is charged to the second potential;

means for redischarging the second rail to the first potential;

means for selectively recharging the second rail to the second potential through another one of the fourth plurality of compensation devices; and means for verifying that the second rail is recharged to the second potential.

20. The integrated circuit described in claim 17 wherein the compensated input/output buffer is coupled to receive compensation control signals from a compensation unit, wherein the compensation unit is coupled to an output of a comparator and a plurality of calibration devices coupled in parallel between a resistance and the first potential, the plurality of calibration devices further coupled in parallel between a first input of the comparator and the first potential, the compensation unit configured to selectively switch each one of the plurality of calibration devices, the integrated circuit further comprising:

means for initializing a voltage at a second input of the comparator substantially equal to the second potential;

means for incrementally decrementing the voltage at the second input of the comparator down to the first potential; and means for monitoring the compensation control signals generated by the compensation unit as the voltage at the second input of the comparator is incrementally decremented to verify that each one of the plurality of calibration devices properly switches.

* * * * *

UNITED STATES PATENT AND TRADEMARK OFFICE
CERTIFICATE OF CORRECTION

PATENT NO. : 6,031,385
DATED : February 29, 2000
INVENTOR(S) : Ilkbahar It is certified that error appears in the above-identified patent and that said Letters Patent is hereby corrected as shown below:

In column 1, at line 21, delete "modem" and insert --modern--.

In column 10, at line 29, after "potential" insert --;--.

Signed and Sealed this

Fifteenth Day of May, 2001

Attest:

NICHOLAS P. GODICI

*Attesting Officer*   *Acting Director of the United States Patent and Trademark Office*